United States Patent [19]

Miyazaki et al.

[11] Patent Number: 4,780,836

[45] Date of Patent: Oct. 25, 1988

[54] METHOD OF TESTING SEMICONDUCTOR DEVICES USING A PROBE CARD

[75] Inventors: Tsutomu Miyazaki; Shin Tozawa; Hisahiko Etoh, all of Ooita, Japan

[73] Assignee: Kabushiki Kaisha Toshiba, Japan

[21] Appl. No.: 893,712

[22] Filed: Aug. 6, 1986

[30] Foreign Application Priority Data

Aug. 14, 1985 [JP] Japan ................... 60-178721
Aug. 14, 1985 [JP] Japan ................... 178732

[51] Int. Cl.[4] .................. G01R 1/06; G01R 31/02
[52] U.S. Cl. ............... 364/551.01; 364/550; 324/158 F; 324/158 P
[58] Field of Search ........... 364/550, 555, 563, 571, 364/579; 324/73 AT, 73 PC, 149, 158 P, 158 F; 73/1 B

[56] References Cited

U.S. PATENT DOCUMENTS

| 3,835,381 | 9/1974 | Garretson et al. | 324/158 P |
| 4,038,599 | 7/1977 | Bove et al. | 324/158 P |
| 4,045,737 | 8/1977 | Coberly | 324/158 P |
| 4,195,259 | 3/1980 | Reid et al. | 324/158 F |
| 4,567,433 | 1/1986 | Ohkubo et al. | 324/158 P |

Primary Examiner—Gary Chin
Attorney, Agent, or Firm—Finnegan, Henderson, Farabow, Garrett and Dunner

[57] ABSTRACT

A method of testing semiconductor devices using a probe card having a plurality of needles thereon comprising intermittently raising a stage on which a semiconductor wafer with a metal film formed on a chip area is deposited, calculating the difference in distance between the position of the stage when the tip of at least one needle among the plurality of needles provided on a probe card disposed above the stage is first brought into contact with the metal film and the position of the stage when all the needles are brought into contact with the metal film, measuring the contact resistance between each of the needles and the metal film when all the needles are brought into contact with the metal film, and performing a probe test when the difference in distance and the contact resistance both satisfy respective predetermined conditions.

16 Claims, 5 Drawing Sheets

METHOD OF TESTING SEMICONDUCTOR DEVICES USING A PROBE CARD

BACKGROUND OF THE INVENTION

This invention relates to a method of testing semiconductor devices using a probe card - a probe test. More particularly, this invention relates to a method of testing semiconductor devices by measuring the maximum variance in distance between the tips of a plurality of needles provided on a probe card and measuring the contact resistance between each needle and the metal film on the corresponding chip area of a semiconductor wafer.

The probe test for checking semiconductor integrated circuit chips (IC chips) which are made on wafers is performed using a probe card with a plurality of needles. In the probe test, a probe with a plurality of needles is disposed above a stage supporting an IC chip thereon.

The tips of the needles are ideally at the same level in height, but actually the level fluctuates somewhat. Where the level fluctuates greatly, the test precision is reduced. For this reason, it is necessary to check the probe card prior to the test. This check is performed using a probe checker. In this case, however, the following problems are raised.

(a) It is necessary to make a periodical check as to whether each needle is at a preset level in the height direction by taking out the probe card.

(b) This check can not be done during the probe test.

(c) The probe checker is expensive, leading to high cost for the measurement.

(d) It is difficult to check the needle level, which requires a precision of several microns, and the contact resistance between each needle and chip area, which is less than 1 (one) ohm.

When measuring the contact resistance between each of the needles provided on a probe card and IC chip supported on a stage, dust is liable to be attached to the tip of needle of the probe card positioned above the state as the needle tip is brought into contact with the IC chip. In such a case, an error is liable to result. To prevent this, the needles are heavily urged against the IC chip by overdriving the stage by a predetermined distance in the same direction after all the needles have been brought into contact with the IC chip.

There are two methods for effecting this.

(a) In one method, the operator observes that all the needles of the probe card are brought into contact with the IC chip area of the wafer, and the stage is raised by a prescribed overdrive extent from that position.

(b) In the other method, the contact of all the needles with the IC chip area is confirmed by a sensor needle, and the stage is raised by an overdrive extent.

The former method, however, requires skill because the check as to whether all the needles are in contact with the wafer is made by naked eyes. Therefore, an error is liable to result depending on the operator, resulting in reduction of the precision of the probe test. In the case of the latter method, damage is liable to be caused to the IC chip by the sensor needle. In addition, the positioning of the needle of the probe and the sensor needle is extremely difficult.

SUMMARY OF THE INVENTION

This invention has been intended in light of the above, and its object is to provide a method of testing semiconductor devices using the probe card method - as described more fully hereinbelow which permits measurement of the variance in vertical height levels between each needle and allows measurement of contact resistance between each needle and the metal film on the corresponding chip area of the semiconductor integrated circuit chip, IC chip, without the use of any probe card checker.

Another object of the invention is to provide a probe test method, with which a predetermined overdrive extension can be automatically set without having to remove the probe card from the probe on a regular basis (e.g., once for each wafer) before performing the probe test or in case of abnormality of probe test, and which can improve the precision of the probe test and dispenses with the use of any sensor needle.

According to the invention, there is provided a probe test method comprising intermittently raising a stage supporting a semiconductor wafer with a metal film formed on a chip area, calculating a level difference between a level position of the tip of a needle first brought into contact with said metal film among a plurality of needles provided on a probe card disposed above said stage and a level position at which all said needles are brought into contact with said metal film, measuring the contact resistance between each of said needles and said metal film when all said needles are brought into contact with the metal film, and causing a probe test when said level difference and contact resistance both meet respective predetermined conditions.

According to the invention, there is further provided a probe test method comprising intermittently raising a stage supporting a semiconductor wafer with a metal film formed on a chip area, detecting a level position of the tip of a needle first brought into contact with said metal film among a plurality of needles provided on a probe card disposed above said stage, detecting a level position at which all said needles are brought into contact with said metal film, calculating the level difference between said level positions, measuring the contact resistance between each of said needles and said metal film when all said needles are brought into contact with the metal film, and causing a probe test when said level difference and contact resistance both meet respective predetermined conditions.

According to the invention, there is still further provided a probe test method comprising intermittently raising a stage supporting a semiconductor wafer with a metal film formed on a chip area, calculating a level first brought into contact with said metal film among a plurality of needles provided on a probe card disposed above said stage and a level position at which all said needles are brought into contact with said metal film, raising said stage by a predetermined amount of overdrive, extension from said level position at which all said needles are brought into contact with said metal film, measuring the contact resistance between each of said needles and said metal film when said stage raises by said predetermined amount of over-drive extension, and performing a probe test when said level difference and contact resistance both meet respective predetermined conditions.

According to the invention, there is yet further provided a probe test method comprising intermittently raising a stage supporting a semiconductor wafer with a metal film formed on a chip area, detecting a level position of the tip of a needle first brought into contact with said metal film among a plurality of needles provided on a probe card disposed above said stage, detecting a level position at which all said needles are brought into contact with said metal film, calculating the level difference between said level positions, raising said stage by a predetermined amount of over-drive from said level position at which all said needles are brought into contact with said metal film, measuring the contact resistance between each of said needles and said metal film when said stage raises by said predetermined amount of over-drive, and causing a probe test when said level difference and contact resistance both meet respective predetermined conditions.

DETAILED DESCRIPTION OF THE PREFERRED EMBODIMENT

An embodiment of the probe test method according to the invention will be described with reference to the drawings.

Figure 1:
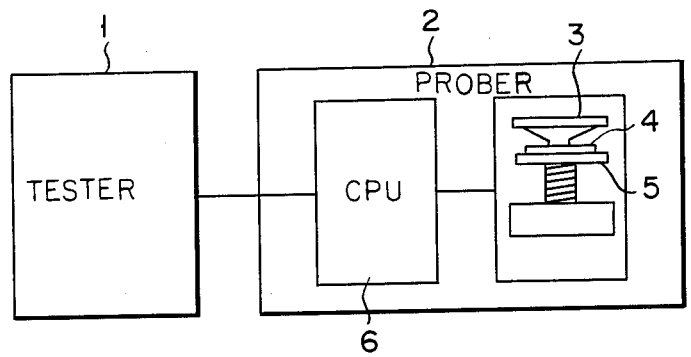
FIG. 1 is a schematic view showing an apparatus for carrying out an embodiment of the probe test method according to the invention.
Figure 2:
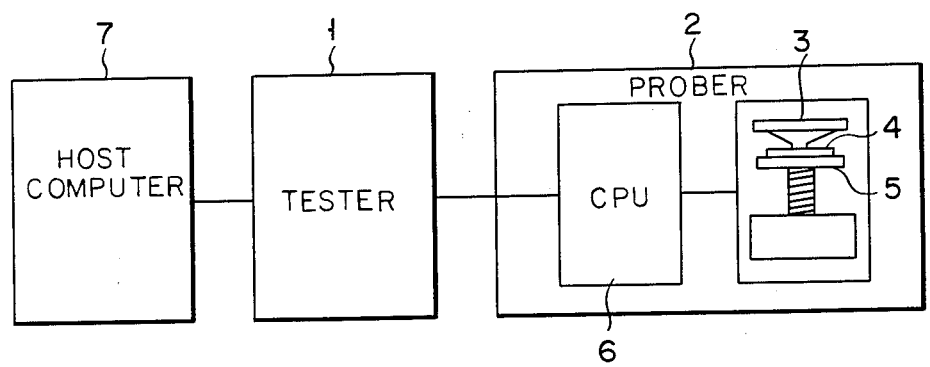
FIG. 2 is a view similar to FIG. 1 but showing the apparatus together with a host computer.

FIGS. 1 and 2 schematically show an apparatus for carrying out an embodiment of the probe test method according to the invention. The apparatus comprises tester 1, prober 2, probe card 3, semiconductor wafer 4, stage 5, central processing unit (CPU) 6 and host computer 7.

CPU 6 controls prober 2, measures the contact resistance between needles (not indicated in FIGS. 1 and 2) provided on probe card 3 and IC chip (not indicated in FIGS. 1 and 2) of wafer 4 and calculates the levels of fluctuation or variance in distance between the tips of the needles. Host computer 7 instructs the replacement of probe card 3 and abnormality of probe card according to the contact resistance and level of fluctuations of the needle tip height calculated by the CPU.

Figure 3:
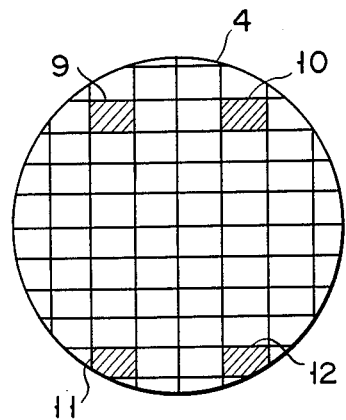
FIG. 3 is a top view showing a semiconductor wafer to be tested by probe test.
Figure 4:
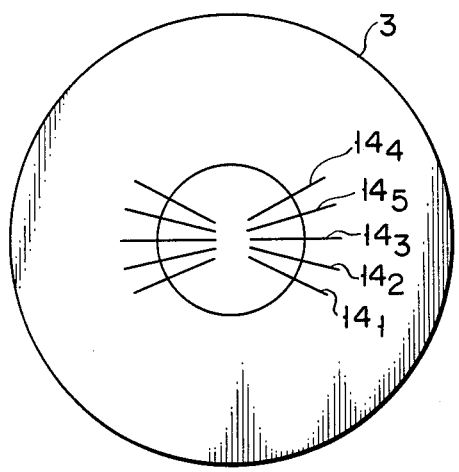
FIG. 4 is a bottom view showing a probe card with a plurality of needles.
Figure 5A:
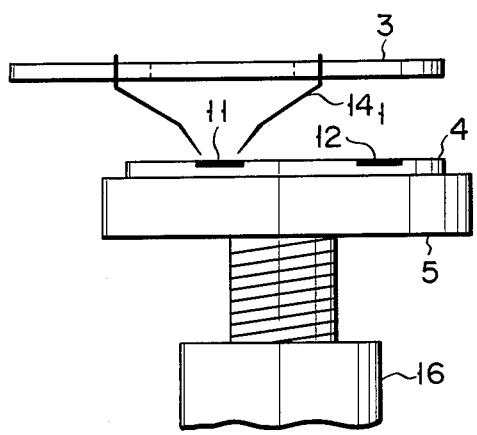
FIGS. 5A and 5B are side views showing the prober.
Figure 5B:
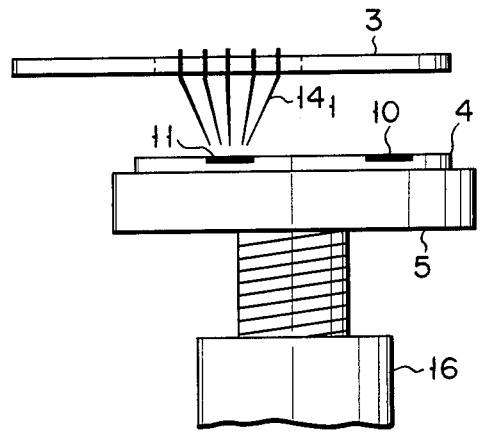

As shown in the top view of FIG. 3, wafer 4 has a plurality of IC chip areas (with only four (4) IC chip areas designated by reference numerals 9, 10, 11 and 12 for the sake of simplicity). Later, wafer 4 is divided into a plurality of IC chips corresponding to these IC chip areas. Wafer 4 has an aluminum films deposited on the entire surface. As shown in the bottom view of FIG. 4, probe card 3 has a plurality of needles $14_1$, $14_2$, $14_3$, $14_4$, $14_5$. As shown in the side views of FIGS. 5A and 5B, wafer 4 is set on stage 5. FIGS. 5A and 5B show the apparatus viewed in directions different from each other by 90°. Probe card 3 is disposed above stage 5.

A plurality of needles 14 of probe card 3 are positioned on IC chip 11 of wafer 4. Beneath stage 5, stage control unit 16 is provided, which can move stage 5 vertically via a support post at intervals of several microns. The extent of vertical movement of stage 5 is calculated by CPU 6.

Figure 6A:
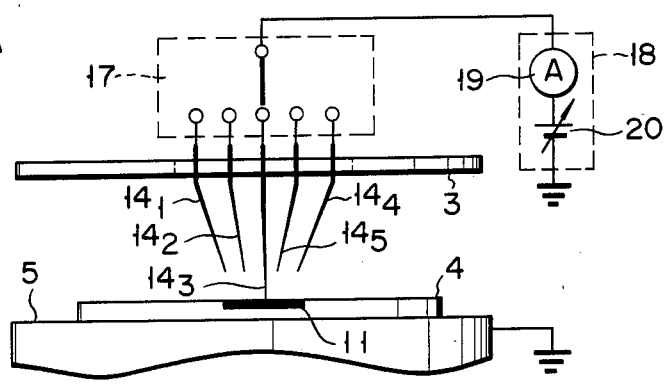
FIGS. 6A to 6D are views showing the positional relation between semiconductor chip and probe when carrying out one embodiment of the probe test method according to the invention.
Figure 6B:
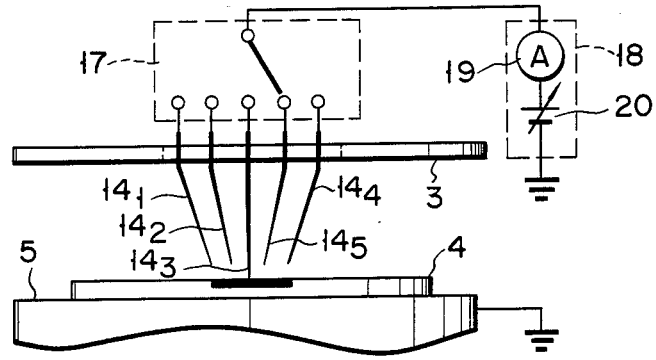
Figure 6C:
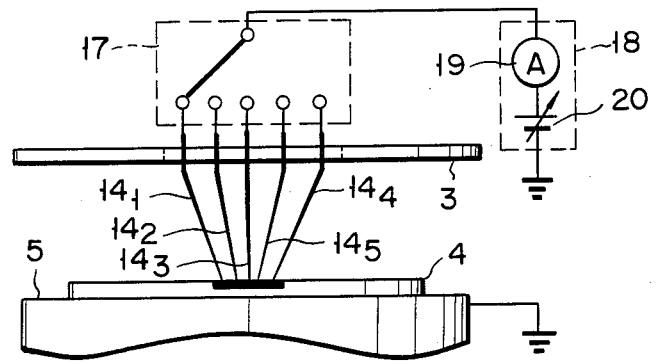
Figure 6D:
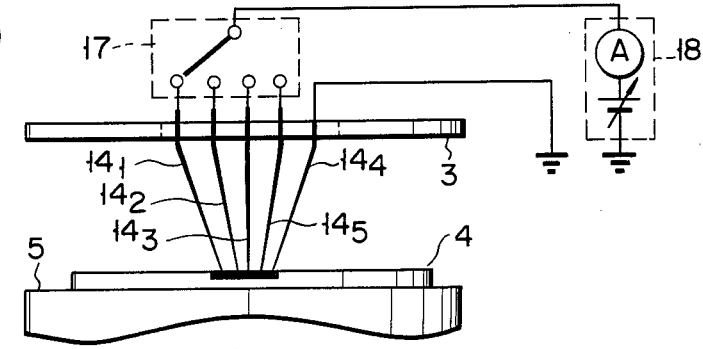
Figure 7:
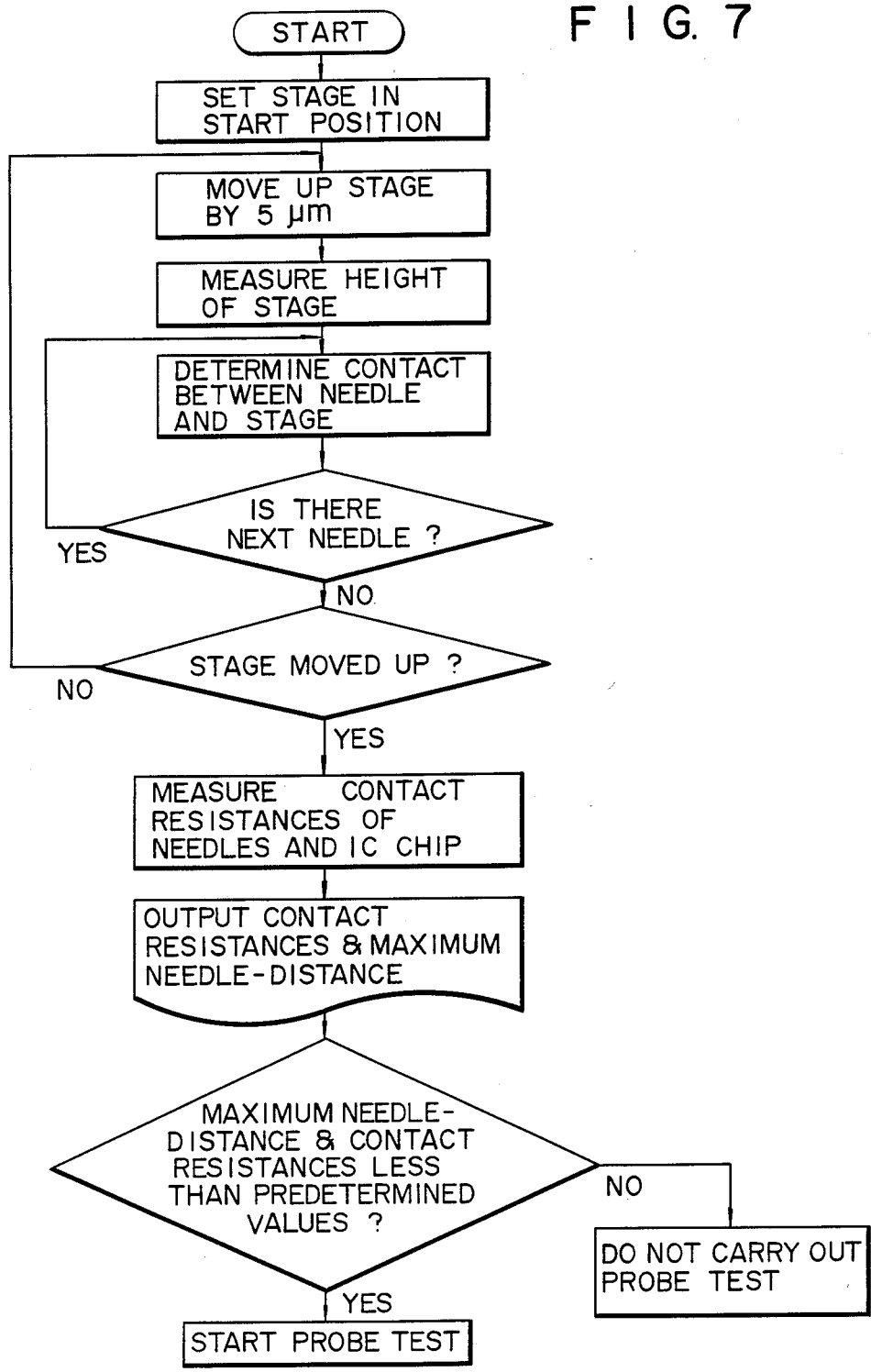
FIG. 7 is a flow chart illustrating the same method.

Now, a method of measurement will be described with reference to FIGS. 6A to 6D and 7. FIGS. 6A to 6D illustrate different states of contact between stage 5 and needles of probe card 3, the state being varied with the vertical movement of the stage 5. FIG. 7 shows a flow chart showing a method of measurement. Referring to FIGS. 6A to 6D, reference numeral 17 designates relay, and 18 measurement system in tester. Measurement system 18 includes ampere meter 19 and battery 20. Relay 17 selects a contact of each of needles $14_1$ to $14_5$ of probe card 3 and connects it to positive terminal of power supply 20. The negative terminal of power supply 20 is grounded.

Wafer 4 is set on sage 5, which is then set at a start position. Then, stage 5 is raised at an interval of a predetermined distance, e.g., 5 μm, and every time the stage is intermittently moved its level is measured and stored. Further, at each of these instances a selection contact of relay 17 is switched from the contact of one needle to the contact of another among needles $14_1$ to $14_5$, and a predetermined voltage is applied from power supply 20 of tester 1. As shown in FIG. 6A, when needle $14_3$ is brought into contact with IC chip 11, an electric current is caused to flow through needle $14_3$. This electric current is read by ampere meter 19. As a result, the contact of needle $14_3$ with the IC chip can be detected. At this time, the level of the stage in the height direction, i.e., the level of needle tip in the height direction, is stored. Stage 5 is subsequently raised intermittently at an interval of 5 μm, and after every intermittent movement the contact of relay 17 is switched between adjacent ones of the contacts of needles $14_1$ to $14_5$, and a check as to whether there is current is done using the ampere meter. In the state shown in FIG. 6B, needles $14_3$ and $14_5$ are in contact with IC chip 11. Thus, when the relay contact selects these needles, current is caused to flow. On the other hand, no current is caused when the other needles are selected. When all the needles are in contact with IC chip 11, current is caused with any of the needles selected by relay contact. At this time, the level of stage in the height direction, i.e., the level of needle tip in the height direction, is stored.

The difference between the level, at which needle 14 is first brought into contact with IC chip 11, and level, at which all the needles are in contact with the IC chip, constitutes the maximum level difference among the tips of the plurality of needles. CPU 6 effects a check as to whether the maximum level difference is less than a predetermined permissible value for the probe test.

CPU 6 also measures the contact resistance between each needle and IC chip 11 when all the needles are brought into contact with IC chip 11 and also effects a check as to whether each contact resistance is less than a predetermined permissible value for the probe test.

When the maximum level difference and contact resistance in this case are both less than the permissible values, host computer 7 does not produce abnormality signal, and the probe test is started.

When either the maximum level difference or contact resistance exceeds the permissible value, host computer 7 produces an abnormality signal, and no probe test is started.

Figure 8:
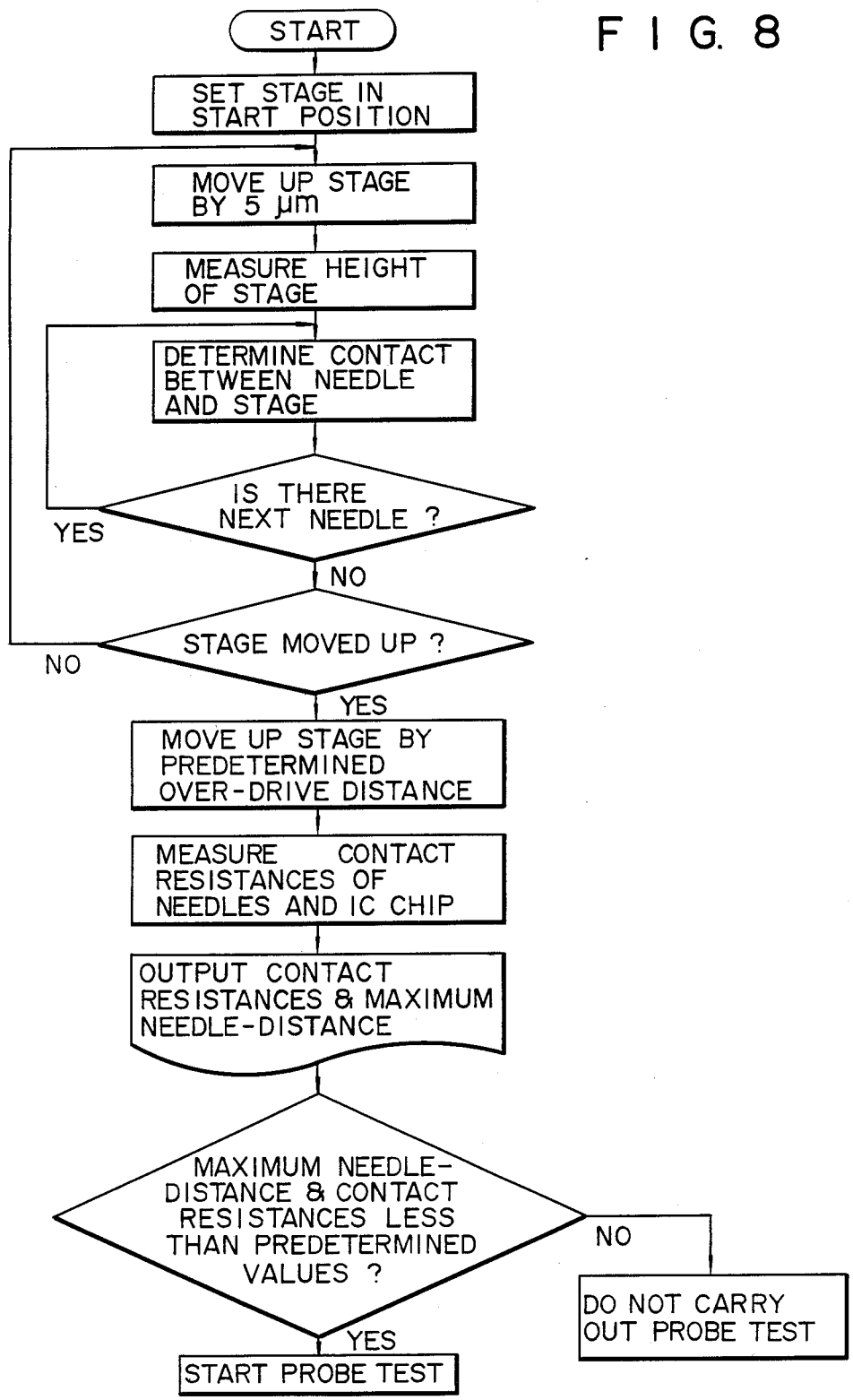
FIG. 8 is a flow chart illustrating a second embodiment of the method according to the invention.

FIG. 8 is a flow chart illustrating a second embodiment of the method according to the invention. This embodiment is substantially the same as the first embodiment except for a certain part, so the description of the like parts is omitted, and only the different parts will be described. In this embodiment, when both the maximum needle tip level difference and contact resistance are less than predetermined permissible values, control unit 16 is driven under control of computer 7 to raise the stage to an extent corresponding to a predetermined overdrive (e.g., 70 μm) from the level position, at which all the needles are brought into contact with IC chip 4, and at this new level position a check as to the contact of each needle with IC chip 4 and measurement of the corresponding contact resistance are done. When the calculated contact resistance is less than a predetermined value, CPU 6 does not provide any abnormality signal, so that the probe test is started. When the calculated contact resistance is above the predetermined value, CPU 6 provides an abnormality signal so that no probe test is started.

It is to be appreciated that the upward movement of the stage by a predetermined distance from the position, at which all the needles are in contact with the IC chip, is caused electrically and automatically. That is, unlike the prior art case there is no possibility of occurrence of judgement difference due to manual operation based on observation with microscope. Thus, the precision of measurement can be improved. Further, since no sensor needle is used, check of the sensor needle is unnecessary, and there is no possibility of damage to wafer by the sensor needle.

Further, the extent of overdrive may not be predetermined, and a suitable overdrive extent can be calculated in correspondence to the maximum needle tip level difference and contact resistance fluctuations.

The above embodiment is by no means limitative, and various other applications are conceivable. For example, in the above embodiments a check as to whether the probe test is to be started is effected after calculations of the maximum needle tip level difference and contact resistance. However, it is possible to effect this check before measurement of the contact resistance.

As has been described in the foregoing, according to the invention the following effects can be obtained.

(1) The maximum needle tip level difference and contact resistance with IC chip, which have heretofore been controlled manually, can be controlled automatically with a prober apparatus.

(2) It is possible to check the maximum needle tip level difference and contact resistance with IC chip without need of taking out prober card from prober.

(3) It is possible to check the maximum needle tip level difference and contact resistance with IC chip periodically, in case of emergency or at any desired time during the probe test. Further, with a probe test system with a host computer as shown in FIG. 2 it is possible to control changes in the maximum needle tip level difference and contact resistance with time.

(4) An expensive probe card checker is unnecessary.

(5) Highly precise needle tip level check and check of contact resistance between the needle tip and IC chip can be obtained automatically.

What is claimed is:

1. A method of testing semiconductor devices using a probe card having a plurality of needles thereon comprising:

intermittently raising a stage supporting a semiconductor wafer with a metal film formed on a chip area;

measuring the difference in distance between the position of the stage when the tip of at least one needle among a plurality of needles provided on a probe card disposed above the stage is first brought into contact with the metal film and the position of the stage when all of the needles are brought into contact with the metal film;

measuring the contact resistance between each of the needles and the metal film when all of the needles are brought into contact with the metal film; and performing a probe test when the difference in distance and the contact resistance both satisfy respective predetermined conditions.

2. The method according to claim 1, wherein the stage is intermittently raised by substantially 5 μm.

3. A method of testing semiconductor devices comprising:

intermittently raising a stage supporting a semiconductor wafer with a metal film formed on a chip area;

detecting a level position of the stage when the tip of at least one needle among a plurality of needles provided on a probe card disposed above the stage is first brought into contact with the metal film;

detecting a level position of the stage when all of the needles are brought into contact with the metal film;

calculating the level difference between the two level positions;

measuring the contact resistance between each of the needles and said metal film when all of the needles are brought into contact with the metal film; and performing a probe test when the level difference and the contact resistance both meet respective predetermined conditions.

4. The method according to claim 3, wherein the stage is intermittently raised by substantially 5 μm.

5. A method of testing semiconductor devices comprising:

intermittently raising the vertical height level of a stage supporting a semiconductor wafer with a metal film formed on a chip area;

calculating a level difference between a level position when at least one needle among a plurality of needles provided on a probe card disposed above the stage is first brought into contact with the metal film and a level position at which all of the needles are brought into contact with the metal film;

raising the stage by a predetermined amount of overdrive extension from the level position at which all of the needles are brought into contact with the metal film;

measuring the contact resistance between each of the needles and the metal film when the stage is raised by the predeteremined amount of over-drive extension; and performing a probe test when the level difference and the contact resistance both meet respective predetermined conditions.

6. The method according to claim 5, wherein the stage is raised by substantially 5 μm.

7. The method according to claim 5, wherein the predetermined amount of over-drive extension the stage is substantially 70 μm.

8. A method of testing semiconductor devices comprising:

intermittently raising a stage supporting a semiconductor wafer with a metal film formed on a chip area;

detecting a level position of the stage when the tip of at least one needle among a plurality of needles provided on a probe card disposed above the stage is first brought into contact with the metal film;

detecting a level position of the stage at which all of the needles are brought into contact with the metal film;

calculating the difference in distance between the level positions;

raising the stage by a predetermined amount of over-drive extension from the level position at which all of the needles are in contact with the metal film;

measuring the contact resistance between each of the needles and the metal film after the stage is raised by the predetermined amount of over-drive extension; and performing a probe test when the difference in distance and the contact resistance both meet respective predetermined conditions.

9. The method according to claim 8, wherein the stage is intermittently raised by substantially 5 $\mu$m.

10. The method according to claim 8, wherein the predetermined amount of over-drive extension of the stage is substantially 70.

11. A method of testing semiconductor device comprising:

intermittently advancing a stage supporting a semiconductor wafer with a metal film formed on a chip area toward a probe card having a plurality of needles thereon, the distance of each intermittent advancing of the stage being a predetermined distance;

detecting a position of the stage when the tip of at least one needle among said plurality of needles provided on a probe card disposed above the stage is first brought into contact with the metal film;

measuring the contact resistance between each needle and the metal film after each intermittent advancing of the stage;

calculating the difference in distance between the position of the stage when the tip of at least one needle is first brought into contact with the metal film and the position of the stage when all of the needles are brought into contact with the metal film;

detecting the position of the stage when all of the needles are brought into contact with the metal film, and ceasing further advancing of the stage when all of the needles are brought into contact with the metal film; and performing a probe test when:

(1) the difference in distance does not exceed a first predetermined value and (2) the contact resistance between each needle and the metal film does not exceed a second predetermined value.

12. The method according to claim 11, wherein whenever the contact resistance exceeds the second predetermined value, no further procedures are conducted and the testing of the semiconductor device is terminated.

13. The method according to claim 11, wherein whenever the difference in distance between the position of the stage when the tip of at least one needle is first brought into contact with the metal film and the position of the stage after each intermittent advancing of the stage exceeds the first predetermined value, no further procedures are conducted and the testing of the semiconductor device is terminated.

14. The method according to claim 11, wherein the stage is intermittently advanced by substantially 5 $\mu$m.

15. The method according to claim 11, wherein after detecting a position of the stage when all of the needles are brought into contact with the metal film, the stage is further advanced by a predetermined amount of over-drive extension before performing a probe test.

16. The method according to claim 15, wherein the predetermined amount of over-drive extension is substantially 70 $\mu$m.

* * * * *